US012612550B2

(12) United States Patent　　　(10) Patent No.: US 12,612,550 B2

Sadamochi　　　　　　　　　　　　(45) Date of Patent: Apr. 28, 2026

(54) SINTERED BODY, LIGHT EMITTING DEVICE, WAVELENGTH CONVERSION MEMBER, AND METHOD FOR MANUFACTURING SINTERED BODY

(71) Applicant: NICHIA CORPORATION, Anan (JP)

(72) Inventor: Takeshi Sadamochi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 873 days.

(21) Appl. No.: 17/995,802

(22) PCT Filed: Apr. 8, 2021

(86) PCT No.: PCT/JP2021/014935
§ 371 (c)(1),
(2) Date: Oct. 7, 2022

(87) PCT Pub. No.: WO2021/206151
PCT Pub. Date: Oct. 14, 2021

(65) Prior Publication Data
US 2023/0143058 A1　　May 11, 2023

(30) Foreign Application Priority Data

Apr. 9, 2020　(JP) ................................. 2020-070180

(51) Int. Cl.
*C09K 11/77*　　(2006.01)
*C04B 35/581*　　(2006.01)
*H10H 20/851*　　(2025.01)
(52) U.S. Cl.
CPC ...... *C09K 11/77346* (2021.01); *C04B 35/581* (2013.01); *H10H 20/8513* (2025.01);
(Continued)

(58) Field of Classification Search
CPC ......................... C04B 35/581; C09K 11/77346
See application file for complete search history.

(56) References Cited

U.S. PATENT DOCUMENTS 5,198,394 A　3/1993　Sugimoto et al.
6,225,249 B1　5/2001　Fujita et al.
(Continued)

FOREIGN PATENT DOCUMENTS

EP　　0548424 A1　6/1993
JP　　S6071575 A　4/1985
(Continued)

OTHER PUBLICATIONS

Hecht. "Photonic Frontiers: Semiconductor UV Lasers: Materials are a tough challenge for ultraviolet diode lasers" from: https://www.laserfocusworld.com/lasers-sources/article/16554809/photonic-frontiers-semiconductor-uv-lasers-materials-are-a-tough-challenge-for-ultraviolet-diode-lasers Dec. 2008 (Year: 2008).*
(Continued)

*Primary Examiner* — Matthew E. Hoban
(74) *Attorney, Agent, or Firm* — Hunton Andrews Kurth LLP

(57) ABSTRACT

Provided is a sintered body that has high heat dissipation and from which light can be emitted when excited by an excitation light source, a light emitting device, a wavelength conversion member, and a method for manufacturing the sintered body.

The sintered body includes aluminum nitride and europium, has a thermal diffusivity of 27.0 mm²/s or greater as measured by a laser flash method at 25° C., and emits green light when excited by an excitation light source.

21 Claims, 13 Drawing Sheets

(52) U.S. Cl.
CPC ................. *C04B 2235/9607* (2013.01); *C04B 2235/9646* (2013.01)

(56) References Cited

U.S. PATENT DOCUMENTS

| | | | |
|---|---|---|---|
| 6,403,510 B1 | 6/2002 | Kuibira et al. | |
| 7,122,490 B2 | 10/2006 | Kobayashi et al. | |
| 7,431,864 B2 | 10/2008 | Hirosaki | |
| 7,553,787 B2 | 6/2009 | Yoshikawa et al. | |
| 7,763,226 B2 | 7/2010 | Yoshikawa et al. | |
| 7,803,733 B2 | 9/2010 | Teratani et al. | |
| 8,022,001 B2 | 9/2011 | Teratani et al. | |
| 8,436,525 B2 | 5/2013 | Hirosaki | |
| 8,852,453 B2 | 10/2014 | Hirosaki | |
| 9,394,206 B2 | 7/2016 | Nobori et al. | |
| 9,670,405 B2 | 6/2017 | Hirosaki | |
| 2004/0171474 A1 | 9/2004 | Kobayashi et al. | |
| 2007/0142205 A1 | 6/2007 | Yoshikawa et al. | |
| 2007/0194685 A1 | 8/2007 | Hirosaki | |
| 2007/0257231 A1 | 11/2007 | Hirosaki | |
| 2008/0012038 A1 | 1/2008 | Teratani et al. | |
| 2008/0242531 A1* | 10/2008 | Teratani ................ C04B 35/581 501/98.6 |
| 2009/0220404 A1 | 9/2009 | Yoshikawa et al. | |
| 2010/0128409 A1 | 5/2010 | Teratani et al. | |
| 2012/0032579 A1 | 2/2012 | Hirosaki | |
| 2012/0248716 A1 | 10/2012 | Nobori et al. | |
| 2014/0332992 A1 | 11/2014 | Hirosaki | |

FOREIGN PATENT DOCUMENTS

| | | |
|---|---|---|
| JP | S6217074 A | 1/1987 |
| JP | S62167260 A | 7/1987 |
| JP | H04149070 A | 5/1992 |
| JP | 2000086345 A | 3/2000 |
| JP | 2001064079 A | 3/2001 |
| JP | 2004250318 A | 9/2004 |
| JP | 2004262750 A | 9/2004 |
| JP | 2007191383 A | 8/2007 |
| JP | 2008038143 A | 2/2008 |
| JP | 2008239386 A | 10/2008 |
| JP | 2010120822 A | 6/2010 |
| JP | 2012216816 A | 11/2012 |
| WO | 2006016711 A1 | 2/2006 |

OTHER PUBLICATIONS

Li. Effect of ultrafine AIN/AI and Eu2O3 powder addition on sintering characteristics and thermal diffusivity of AIN and machine translation. Nippon Kinzoku Gakkaishi. 1997 vol. 61 Issue 2, p. 99-104 (Year: 1997).*

AZO materials. Aluminium Nitride / Aluminum Nitride (AIN)—Properties and Applications. retrieved online from https://www.azom.com/properties.aspx?ArticleID=610 on Oct. 3, 2025 (Year: 2025).*

\* cited by examiner

SINTERED BODY, LIGHT EMITTING DEVICE, WAVELENGTH CONVERSION MEMBER, AND METHOD FOR MANUFACTURING SINTERED BODY

CROSS-REFERENCE TO RELATED APPLICATIONS

This application is a national stage entry of International Application No. PCT/JP2021/014935, filed on Apr. 8, 2021, which claims priority to Japanese Patent Application No. 2020-070180, filed on Apr. 9, 2020, the disclosures of which are hereby incorporated by reference in their entireties.

TECHNICAL FIELD

The present invention relates to a sintered body, a light emitting device, a wavelength conversion member, and a method for manufacturing the sintered body.

BACKGROUND ART

A light emitting device that uses a light emitting element of a light emitting diode (LED) or a laser diode (LD) is a light source having high conversion efficiency, has low power consumption, and can be reduced in size, and thus is utilized as an alternative power source to an incandescent bulb and a fluorescent bulb. For example, a light emitting device that uses a fluorescent member including an LED, an inorganic phosphor in a powder form, and a resin emits mixed light of light emitted from the LED and light emitted from the inorganic phosphor excited by the light emitted from the LED. Such a light emitting device that uses an LED and an inorganic phosphor is utilized not only in lighting fields such as indoor lighting and in-vehicle lighting, but also in a wide range of fields such as liquid crystal backlight light sources and illumination. Further, a light emitting device that combines an LD and an inorganic phosphor has been utilized in fields such as projector light sources.

Patent Document 1 discloses a method for manufacturing sialon phosphor, including directly supplying, in a container or the like, powder aggregations of a mixture having uniform particle size at a filling ratio exhibiting a bulk density of 40% or less and then sintered, without applying a mechanical force to the powder and without being molded in advance using a mold or the like.

CITATION LIST

Patent Documents

Patent Document 1: WO 2006/016711

SUMMARY OF INVENTION

Technical Problem

Nevertheless, in the method described in Patent Document 1, it is difficult to obtain a dense sintered body, and improvement in heat dissipation of the sintered body is desired. Therefore, an object of the present disclosure is to provide a sintered body that has high heat dissipation and emits light when excited by an excitation light source, a light emitting device, a wavelength conversion member, and a method for manufacturing the sintered body.

Solution to Problem

The present disclosure encompasses the following aspects.

A first aspect of the present disclosure is a sintered body that includes aluminum nitride and europium. The sintered body has a thermal diffusivity of 27.0 mm²/s or greater as measured by a laser flash method at 25° C., and emits green light when excited by an excitation light source.

A second aspect of the present disclosure is a sintered body including aluminum nitride and europium. The sintered body has a thermal diffusivity of 27.0 mm²/s or greater as measured by a laser flash method at 25° C., and a content of the europium is in a range from 0.2 mass % to 10 mass % relative to a total amount.

A third aspect of the present disclosure is a light emitting device including the sintered body and an excitation light source.

A fourth aspect of the present disclosure is a wavelength conversion member including aluminum nitride and europium. The wavelength conversion member has a thermal diffusivity of 27.0 mm²/s or greater as measured by a laser flash method at 25° C., and a content of the europium is in a range from 0.2 mass % to 10 mass % relative to a total amount.

A fifth aspect of the present disclosure is a method for manufacturing a sintered body, the method including providing a raw material mixture by mixing aluminum nitride and europium, providing a formed body including the raw material mixture, and firing the formed body in a temperature range from 1700° C. to 2050° C. to obtain a sintered body that emits green light when excited by an excitation light source.

A sixth aspect of the present disclosure is a method for manufacturing a sintered body, the method including providing a formed body of a raw material mixture including aluminum nitride and a compound including europium, and firing the formed body in a range from 1700° C. to 2050° C. to obtain a sintered body. A content of the compound including europium in the raw material mixture is in a range from 0.2 mass % to 20 mass % relative to 100 mass % of the raw material mixture.

Advantageous Effects of Invention

According to the aspects described above, a sintered body that has high heat dissipation and emits light when excited by an excitation light source, a light emitting device, a wavelength conversion member, and a method for manufacturing the sintered body can be provided.

DESCRIPTION OF EMBODIMENTS

Figure 1:
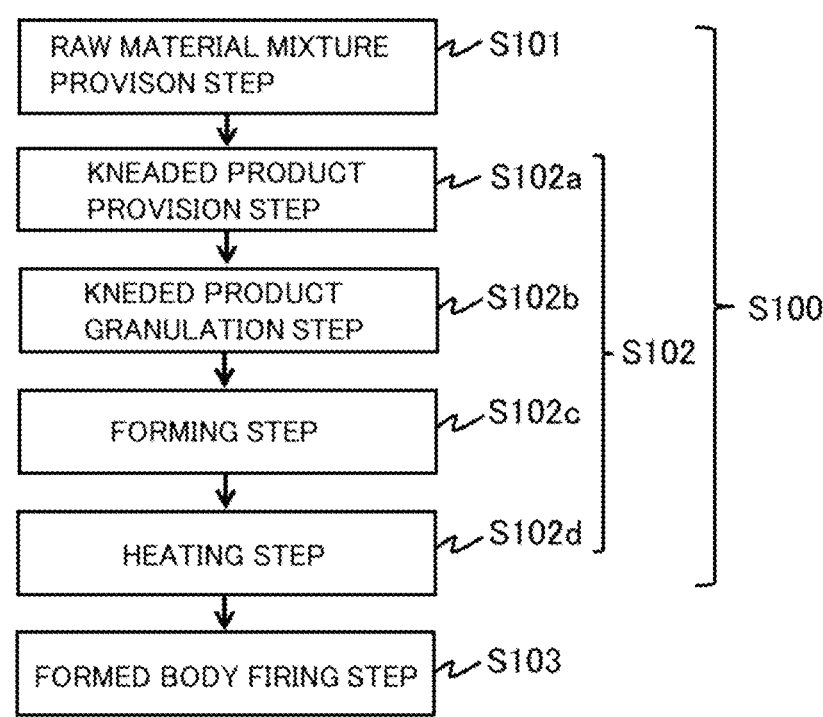
FIG. 1 is a flowchart illustrating an example of a method for manufacturing a sintered body according to the present embodiment.

Below, a sintered body, a light emitting device, a wavelength conversion member, and a method for manufacturing the sintered body according to the present disclosure will be described with reference to embodiments. However, the embodiments illustrated below are examples for embodying the technical concept of the present invention, and the present invention is not limited to the following sintered body, light emitting device, wavelength conversion member, and method for manufacturing the sintered body. Note that, in this specification, green light refers to light having a light emission peak wavelength in a range from 490 nm to 570 nm.
Sintered Body The sintered body includes aluminum nitride and europium, and a thermal diffusivity thereof measured by a laser flash method at 25° C. is 27.0 mm²/s or greater. The sintered body emits green light when excited by an excitation light source.

Further, in the sintered body, a content of the europium is in a range from 0.2 mass % to 10 mass % relative to a total amount.

The sintered body includes a base material formed of the aluminum nitride, and the europium serving as a light emission center, and thus emits green light upon absorption of the light from the excitation light source. The europium included in the sintered body may be europium derived from europium included in a sintering aid used when sintering the aluminum nitride powder that is a raw material. The sintered body, with the powder of the aluminum nitride bonded together by the sintering aid, has a high density and a high thermal diffusivity of 27.0 mm²/s or greater as measured by a laser flash method. The thermal diffusivity of the sintered body measured by the laser flash method at 25° C. may be 28.0 mm²/s or greater, may be 30.0 mm²/s or greater, may be 50.0 mm²/s or greater, may be 55.0 mm²/s or greater, may be 60.0 mm²/s or greater, or may be 65.0 mm²/s or greater. Thermal conductivity is determined by the product of thermal diffusivity, specific heat capacity, and density. Thus, a sintered body having high thermal diffusivity has high thermal conductivity and high heat dissipation. In a case in which the sintered body includes aluminum nitride at 100 mass % and has a density equivalent to the density of aluminum nitride (kg/m³), the theoretical thermal conductivity of aluminum nitride is 320 W/m·K. At this time, the thermal diffusivity of the sintered body is 136.3 mm²/s. Thus, the thermal diffusivity of the sintered body may be 136.3 mm²/s or less.

A thermal diffusivity $\alpha$ of the sintered body can be measured in a 10 mm (length)×10 mm (width)×2 mm (thickness) sample, for example, using a laser flash analyzer (for example, LFA 447 manufactured by NETZSCH GmbH & Co.) based on a laser flash method at 25° C. A specific heat capacity Cp utilized as the specific heat capacity of aluminum nitride (AlN) in this specification is 0.72 KJ/kg·K. Further, the apparent density of the sintered body can be calculated by equation (1) below using the volume measured by the Archimedes method.

[Equation 1]

Apparent density$\rho$(kg/m³) of sintered body mass
   (kg) of sintered body÷volume of sintered body
   (Archimedes method)　　　　(1)

A thermal conductivity $\kappa$ of the sintered body can be calculated by the product of the measured thermal diffusivity $\alpha$, the specific heat capacity Cp, and a density $\rho$ (apparent density), specifically by equation (2) below.

[Equation 2]

Thermal conductivity $\lambda$ (W/m·K)=thermal
   diffusivity$\alpha$(m²/s)×specific heat capacity Cp
   (J/kg·K)×apparent density $\rho$(kg/m³)　　　　(2)

The apparent density of the sintered body is preferably 2.5 g/cm³ (0.0025 kg/m³) or greater. The apparent density of the sintered body is more preferably 2.9 g/cm³ or greater, even more preferably 3.0 g/cm³ or greater, and particularly preferably 3.1 g/cm³ or greater. When the density of the sintered body is in these ranges, a sintered body having low porosity and high thermal diffusivity can be obtained. The apparent density of the sintered body is 3.5 g/cm³ or less.

The sintered body is preferably excited by an excitation light source and emits green light having a light emission peak wavelength in a range from 500 nm to 550 nm. The sintered body may have a light emission peak wavelength of light excited by the excitation light source in a range from 510 nm to 545 nm or in a range from 520 nm to 540 nm.

The excitation light source is preferably a light emitting element that emits light having a light emission peak wavelength in a range from 200 nm to 480 nm. From the perspective of efficiently exciting the sintered body, the light emission peak wavelength of the light emitted from the excitation light source may be in a range from 300 nm to 450 nm, may be in a range from 330 nm to 450 nm, may be in a range from 340 nm to 430 nm, or may be in a range from 360 nm to 430 nm, for example.

The content of the europium in the sintered body is preferably in a range from 0.2 mass % to 10 mass % relative to 100 mass % of a total amount of the sintered body. The content of the europium in the sintered body is more preferably in a range from 0.3 mass % to 8 mass %, even more preferably in a range from 0.4 mass % to 7 mass %, and yet even more preferably in a range from 0.5 mass % to 6 mass %, relative to the total amount of the sintered body. When the content of the europium in the sintered body is in the range from 0.2 mass % to 10 mass % relative to 100 mass % of the total amount of the sintered body, a sufficient amount of europium serving as the light emission center is included in the sintered body for emitting green light by the light from the excitation light source. Further, when the content of the europium included in the sintered body is in the range from 0.2 mass % to 10 mass % relative to the total amount, the europium can be disposed in the aluminum nitride particles and between the aluminum nitride particles. As a result, both green light emission by the sintered body and a dense sintered body can be achieved. Further, from the perspective of luminous intensity, the content of the europium included in the sintered body may be in a range from 0.2 mass % to 2 mass % relative to the total amount. When the content of the europium included in the sintered body is in the range from 0.2 mass % to 2 mass %, the luminous intensity can be further improved. As a factor for improving the luminous intensity, suppression of concentration quenching, for example, is conceivable. The content of the europium in the sintered body can be measured by an inductively coupled high-frequency plasma atomic emission spectrometry (ICP-AES) system after acidolysis of the sintered body. Further, from the perspective of luminous intensity, the content of the europium included in the sintered body is preferably in a range from 0.2 mass % to 1.7 mass % relative to the total amount of the sintered body, and more preferably in a range from 0.5 mass % to 1.7 mass % relative to the total amount of the sintered body. As a result, the luminous intensity can be further improved.

The europium in the sintered body is present in the aluminum nitride particles and between the aluminum nitride particles. The europium in the sintered body may be europium derived from a sintering aid. The sintering aid melts the oxide present on the surface of the aluminum nitride, increasing the sinterability of the aluminum nitride that is the base material. The sintering aid preferably does not remain in the sintered body in the form of a sintering aid. This makes it possible to suppress a decrease in thermal conductivity caused by residual sintering aid. Therefore, the europium is present between the aluminum nitride particles. The europium in the sintered body is also present in the aluminum nitride particles constituting the base material, and functions as a light emission center when excited by the excitation light source. The europium in the sintered body is present mostly between aluminum nitride particles adhered to aluminum nitride particles by sintering. The amount of europium present in the aluminum nitride particles is less compared to that of the europium present between the aluminum nitride particles.

A europium amount $X_1$ and an aluminum amount $Y_1$ present in the aluminum nitride particles of the sintered body can be measured by cutting the sintered body and thus exposing a cross section of the sintered body, and performing compositional analysis at specific points in the cross section using, for example, a field emission electron probe microanalyzer (for example, model number JXA-8500F manufactured by JEOL Ltd.) that uses an electron probe microanalyzer (EPMA) analysis method, and/or a scanning electron microscope-energy dispersive X-ray analysis (SEM-EDX) system (for example, model number SU8230 manufactured by Shimadzu Corporation, and a silicon drift detector (SDD device) manufactured by Horiba, Ltd.). For example, discretionary three to five points can be selected in the aluminum nitride particles in discretionary cross section of the sintered body, the europium amount and the aluminum amount in the aluminum nitride particles at the selected sites can be detected, and then the arithmetic average values can be set as the europium amount $X_1$ and the aluminum amount $Y_1$ present in the aluminum nitride particles of the sintered body. However, the amount of the europium in the aluminum nitride particles of the sintered body is so much less that it may not be measurable by the SEM-EDX system due to the sensitivity of the system. In this case, it should be measured by the EPMA system. A first ratio $X_1/Y_1$ of the europium amount $X_1$ to the aluminum amount $Y_1$ present in the aluminum nitride particles of the sintered body is preferably in a range from 0.0005 to 0.15, more preferably in a range from 0.0006 to 0.1, and even more preferably in a range from 0.00075 to 0.075.

Further, a europium amount $X_2$ and an aluminum amount $Y_2$ present between the aluminum nitride particles in the sintered body can also be similarly measured using the EPMA system and/or the SEM-EDX system described above. A second ratio $X_2/Y_2$ of the europium amount $X_2$ to the aluminum amount $Y_2$ present between the aluminum nitride particles of the sintered body is preferably in a range from 0.5 to 15, more preferably in a range from 0.7 to 12, and even more preferably in a range from 1 to 10. The sintered body includes aluminum nitride particles including europium, and a composite oxide including europium. The composite oxide including europium is derived from a liquid phase produced by the oxide on the surface of the aluminum nitride reacting with the compound including europium in the manufacturing process of the sintered body, as described below.

Note that the sintered body may include metal elements other than the aluminum and the europium in an amount no greater than 1 mass % relative to the entire sintered body. Preferably, the amount is 0.5 mass % or less, and more preferably 0.1 mass % or less. Further, the sintered body may also be a sintered body composed of aluminum nitride and europium, without the inclusion of metal elements other than the aluminum and the europium. Further, the base material of the sintered body may be aluminum nitride, and the sintered body may not include metal elements other than the aluminum and the europium. In this way, coloring of the sintered body can be suppressed. This makes it possible to suppress light absorption by a colored portion and thus improve light extraction efficiency.

Wavelength Conversion Member

The sintered body described above can also be referred to as a wavelength conversion member. The wavelength conversion member includes aluminum nitride and europium. The wavelength conversion member has a thermal diffusivity of 27.0 mm$^2$/s or greater as measured by a laser flash method at 25° C. Further, in the wavelength conversion member, a content of the europium is in a range from 0.2 mass % to 10 mass % relative to a total amount. The wavelength conversion member can adopt the same configuration as that of the sintered body described above. The sintered body manufactured by the method for manufacturing a sintered body described below can also be referred to as a wavelength conversion member, and the method for manufacturing a sintered body can also be referred to as a method for manufacturing a wavelength conversion member.

Method for Manufacturing Sintered Body

The method for manufacturing a sintered body includes providing a formed body of a raw material mixture including aluminum nitride and a compound including europium, and firing the formed body in a temperature range from 1700° C. to 2050° C. The sintered body emits green light when excited by an excitation light source.

FIG. 1 is a flowchart illustrating an example of the method for manufacturing a sintered body. The steps of the method for manufacturing a sintered body will now be described with reference to FIG. 1. The method for manufacturing a sintered body includes step S100 of providing a formed body of a raw material mixture including aluminum nitride and a compound including europium, and step S103 of firing the formed body. The step S100 of providing a formed body of a raw material mixture including aluminum nitride and a compound including europium includes step S101 of providing the raw material mixture including the aluminum nitride and the compound including europium, and step S102 of providing the formed body including the raw material mixture. The step S102 of providing the formed body including the raw material mixture preferably includes step S102a of providing a kneaded product by kneading the raw material mixture and an organic substance, step S102c of forming the kneaded product, and step S102d of heating the kneaded product being formed. The step S102 of providing the formed body including the raw material mixture may include step S102b of granulating the kneaded product into a granular form or a pellet form after step S102a of providing the kneaded product.

Raw Material Mixture Provision Step

The raw material mixture includes the compound including europium, and the aluminum nitride. The raw material mixture may include the aluminum nitride and a compound other than the compound including europium.

Aluminum Nitride

As the aluminum nitride serving as the base material of the sintered body, aluminum nitride in powder form can be used. This aluminum nitride in powder form can be manufactured by a known manufacturing method. For example, the aluminum nitride may be obtained by combustion synthesis or direct nitriding in which metallic aluminum powder is combusted in a nitrogen atmosphere, or by reductive nitriding in which aluminum oxide powder is heated and reduced in nitrogen. Further, the aluminum nitride may be obtained by a reaction between organic aluminum and ammonia.

In this specification, a central particle size Da of the aluminum nitride particles is the particle size corresponding to 50% in a volume-based cumulative particle size distribution measured by the Coulter counter method. The Coulter counter method is a method of measuring a particle size without distinguishing primary particles and secondary particles by utilizing electrical resistance when particles dispersed in an electrolyte aqueous solution pass through a pore (aperture) on the basis of the Coulter principle.

The central particle size Da of the aluminum nitride particles constituting the aluminum nitride powder is preferably in a range from 0.1 μm to 5 μm, more preferably in a range from 0.3 μm to 3 μm, and even more preferably in a range from 0.5 μm to 1.5 μm. When the central particle size Da of the aluminum nitride particles is less than 0.1 μm, the central particle size of the aluminum nitride particles is too small and, due to the reaction with water vapor in the atmosphere, an oxide film tends to form on the particle surface. As a result, because the oxygen content in the aluminum nitride powder increases, oxygen is mixed in aluminum nitride crystals during firing, and a composite oxide including aluminum and nitrogen is readily formed. Furthermore, oxygen (O) enters the nitrogen (N) site in the aluminum nitride crystals during firing, producing point defects of aluminum (Al) that scatter the phonons, decreasing the thermal conductivity of the sintered body. Further, when the central particle size Da of the aluminum nitride particles is greater than 5 μm, it may be difficult to obtain a dense sintered body of aluminum nitride even if a sintering aid is added. That is, when the central particle size Da of the aluminum nitride particles is in a range from 0.1 μm to 5 μm, a dense sintered body can be obtained while reducing the mixture of oxygen into the aluminum nitride crystals during firing and suppressing a decrease in thermal conductivity.

In the aluminum nitride powder, the content of oxygen is preferably 2 mass % or less, more preferably 1.5 mass % or less, relative to the total amount of the aluminum nitride powder. The content of the oxygen in the aluminum nitride powder can be measured with an oxygen/nitrogen analyzer (for example, model number EMGA-820, Horiba, Ltd.). When the content of the oxygen in the aluminum nitride powder is 2 mass % or less, point defects of Al in the lattice of the aluminum nitride crystals constituting the base material of the sintered body can be reduced, and a sintered body having high heat dissipation can be manufactured.

Preferably, the aluminum nitride powder does not include discretionary metal elements except for aluminum. In particular, when iron is included, the obtained sintered body may be colored black, and thus preferably iron is not included. The content of the metal elements excluding aluminum in the aluminum nitride powder is preferably 1 mass % or less, more preferably 0.5 mass % or less, even more preferably 0.1 mass % or less, and particularly preferably 0.01 mass % or less, relative to the total amount of the aluminum nitride powder. The content of the metal elements excluding aluminum in the aluminum nitride powder can be measured by an inductively coupled high-frequency plasma atomic emission spectrometry (ICP-AES) system.

The aluminum nitride powder preferably has a reflectivity of 50% or greater, more preferably 70% or greater, in a wavelength range from 400 nm to 700 nm. When the reflectivity of the aluminum nitride powder is 50% or greater in the wavelength range from 400 nm to 700 nm, the reflectivity of the obtained sintered body is also increased, making it possible to increase the luminous intensity of the green light when excited by the excitation light source.

The aluminum nitride powder in the raw material mixture is preferably in a range from 80 mass % to 99.8 mass % relative to 100 mass % of the raw material mixture. When the content of the aluminum nitride powder in the raw material mixture is in the range from 80 mass % to 99.8 mass % relative to the raw material mixture, a sintered body having high thermal diffusivity with the aluminum nitride can be obtained as the base material. Further, the content is more preferably in a range from 85 mass % to 99.7 mass %, even more preferably in a range from 90 mass % to 99.6 mass %, yet even more preferably in a range from 95 mass % to 99.6%, and particularly preferably in a range from 95 mass % to 99.5 mass %. Further, the content of the aluminum nitride powder in the raw material mixture may be in a range from 97 mass % to 99.5 mass % relative to the raw material mixture. As a result, a dense sintered body can be obtained when fired along with a compound containing europium. Thus, the thermal diffusivity can be increased, making it possible to improve the thermal conductivity and improve the luminous intensity.

Compound Including Europium

Examples of compounds including europium include oxides or fluorides including europium. The compound including europium is a compound that includes an element that is a light emission center, and can be used as a sintering aid. Examples of oxides including europium include europium oxide ($Eu_2O_3$). Examples of fluorides including europium include europium fluoride. Preferably, the compound including europium is an oxide including europium. Specifically, the compound is preferably europium oxide.

The compound including europium in the raw material mixture is preferably in a range from 0.2 mass % to 20 mass % relative to 100 mass % of the raw material mixture. When the content of the compound including europium in the raw material mixture is in the range from 0.2 mass % to 20 mass %, a sintered body in which the aluminum nitride particles are densely bonded to each other can be obtained by the liquid phase between the aluminum nitride particles formed including the elements in the compound containing europium. For example, in a case in which the compound including europium is europium oxide ($Eu_2O_3$), the reaction between europium oxide and the oxide formed on the surface of the aluminum nitride generates a liquid phase, making it possible to obtain a sintered body in which the aluminum nitride particles are densely bound to each other by a composite oxide derived from the liquid phase formed between the aluminum nitride particles. The compound including europium in the raw material mixture is more preferably in a range from 0.3 mass % to 15 mass %, even more preferably in a range from 0.4 mass % to 10 mass %, yet even more preferably in a range from 0.4 mass % to 5 mass %, and particularly preferably in a range from 0.5 mass % to 5 mass %, relative to 100 mass % of the raw material mixture. Further, from the perspective of improving the luminous intensity, the compound including europium in the raw material mixture is preferably in a range from 0.5 mass % to 3 mass % relative to 100 mass % of the raw material mixture. This makes it possible to manufacture a sintered body having high luminous intensity. This is conceivably because, for example, a sintered body is obtained in which the europium is contained in the aluminum nitride particles to the extent that concentration quenching is suppressed. The europium included in the compound including europium is present between the aluminum nitride particles and in the aluminum nitride particles due to the sintering. It is speculated that the europium present in the aluminum nitride particles constituting the base material of the sintered body serves as the light emission center of the green light emitted by the sintered body when excited. The content of the compound including europium in the raw material mixture is set to 20 mass % or less, making a decrease in the thermal conductivity of the obtained sintered body less likely. This is because, during sintering, the reaction between the compound including europium and the oxide formed on the surface of aluminum nitride forms a composite oxide between the aluminum nitride particles, but the ratio of the composite oxide remaining in the sintered body is not excessively high. Further, when the content of the compound including europium in the raw material mixture is 20 mass % or less, the amount of the liquid phase produced does not become excessively great, the shrinkage of the sintered body is reduced in the firing process, the dimensional accuracy of the obtained sintered body is improved, and a sintered body having the intended shape is more readily obtained.

The compound including europium is preferably a powder. A particle size ratio De/Da of a central particle size De of the compound particles including europium constituting the powder to the central particle size Da of the aluminum nitride particles is preferably in a range from 0.1 to 20. The central particle size De of the compound particles including europium refers to the particle size corresponding to 50% in a volume-based cumulative particle size distribution measured by the Coulter counter method. When the particle size ratio De/Da of the central particle size De of the compound particles including europium to the central particle size Da of the aluminum nitride particles is in the range from 0.1 to 20, the particles constituting the raw material mixture are less likely to aggregate and are readily dispersed among the particles, making it easy to obtain a sintered body having high density. The particle size ratio De/Da of the central particle size De of the compound particles including europium to the central particle size Da of the aluminum nitride particles is more preferably in a range from 0.2 to 18, even more preferably in a range from 0.3 to 15, and particularly preferably in a range from 0.5 to 10. With these ranges, bias is unlikely to occur in the state after mixture with the aluminum nitride powder.

The raw material mixture may include a compound in addition to the aluminum nitride and the compound including europium. For example, in addition to the compound including europium, a compound including an alkaline earth metal or a compound including yttrium may be included as a sintering aid. Examples of compounds including an alkaline earth metal include an oxide including an alkaline earth metal.

Examples of compounds including yttrium include yttrium oxide ($Y_2O_3$). When a compound including an alkaline earth metal element or a compound including yttrium is included as a sintering aid in addition to the compound including europium, the content of these compounds is preferably not greater than one-half, more preferably not greater than one-third, of the compound including europium included in the raw material mixture. For example, in a case in which the raw material mixture includes aluminum nitride, the compound including europium, and the compound including yttrium, and the content of the europium compound is 0.2 mass %, the content of the compound including yttrium is preferably no greater than 0.1 mass %. Further, the raw material mixture need not include another compound as a sintering aid in addition to the aluminum nitride and the compound including europium.

The raw material mixture including the aluminum nitride, the compound including europium, the compound including an alkaline earth metal as necessary, and the compound including yttrium as necessary can be obtained by dry mixing. Dry mixing refers to mixing the aluminum nitride and each compound in the absence of liquid. The raw material mixture can also be obtained by wet mixing with the presence of an organic solvent or water. Preferably, an organic solvent is used. For dry mixing, a known device such as a super mixer, an axial mixer, a Henschel mixer, a ribbon mixer, or a locking mixer can be used. For wet mixing, a known device such as a ball mill or media agitation mill can be used. The preferred mixing method is dry mixing. In the case of dry mixing, the mixed powder may include large and small particles as sintering aids. Relatively large sintering aid particles are considered likely to produce a localized liquid phase. Conceivably, the localized liquid phase facilitates rearrangement of the aluminum nitride particles, facilitating formation of a dense sintered body. Further, aluminum nitride is sensitive to moisture, and thus dry mixing without the use of moisture is preferred. Further, using dry mixing can simplify the manufacturing process compared to wet mixing.

Forming Step

Kneaded Product Provision Step

The method for manufacturing a sintered body may include providing a kneaded product by kneading the raw material mixture and an organic substance. Examples of the organic substance include those used as binders, lubricants, and plasticizers. The organic substance included in the kneaded product may be in an amount that can sufficiently mix the raw material mixture and the organic substance without affecting the properties of the obtained sintered body. The organic substance included in the kneaded product is preferably in a range from 10 parts by mass to 25 parts by mass relative to 100 parts by mass of the raw material mixture.

Examples of the organic substance as a binder include at least one thermoplastic resin selected from the group consisting of low-density polyethylene, medium-density polyethylene, high-density polyethylene, low molecular weight polyethylene, ethylene-vinyl acetate copolymer, ethylene acrylate copolymer, polypropylene, atactic polypropylene, polystyrene, polyacetal, polyamide, and methacrylic resin. In addition to these thermoplastic resins, examples of binders include waxes such as paraffin wax and microcrystalline wax. These binders may be used alone or in combination of two or more.

Examples of the organic substance as a lubricant include hydrocarbon-based lubricants such as liquid paraffin and paraffin wax, and fatty acid-based lubricants such as stearic acid and lauryl acid. These lubricants may be used alone or in combination of two or more. The paraffin wax may be used as a binder and may be used as a lubricant.

Examples of the organic substance as a plasticizer include phthalates, adipates, and trimellitates. These plasticizers may be used alone or in combination of two or more.

The kneaded product may include an auxiliary agent such as a coupling agent to improve the dispersion of inorganic powders such as the aluminum nitride and the compound including europium and the at least one organic substance selected from the group consisting of binders, lubricants, and plasticizers. The auxiliary agent such as the coupling agent may be added to the kneaded product in a range that does not affect the properties of the obtained sintered body.

The kneaded product can be obtained by using a known device. Examples of the known device include single-shaft rotor kneaders, twin-shaft rotor kneaders, single-shaft screw kneaders, twin-shaft screw kneaders, extruders, kneaders, pressurized kneaders, and Banbury mixers.

Kneaded Product Granulation Step

The kneaded product may be granulated into a granular form or a pellet form prior to forming the formed body. The kneaded product having a granular form or a pellet form can be obtained by using a known device such as a pulverizer, an extruder, or a pelletizer.

Forming Step

The method for manufacturing a sintered body includes providing the formed body including the raw material mixture. The formed body may be obtained by forming the raw material mixture, may be obtained by forming the kneaded product including the raw material mixture and the organic substance, or may be obtained by forming the granulated kneaded product. The formed body can be obtained by forming the raw material mixture or the kneaded product by a known method. Examples of the known forming method include an injection forming method, a press molding method that uses a mold, a cold isostatic pressing (CIP) method, an extrusion method, a doctor blade method, and a casting method. The injection forming method can form a formed body having a desired shape. When the formed body is formed by the injection forming method, cutting or otherwise shaping the sintered body into the desired shape is not necessarily required after firing the formed body to obtain the sintered body. The aluminum nitride is included as the base material, and the high density sintered body is extremely hard and brittle, making machining such as cutting difficult. Further, a defect such as chipping may occur when subjecting the sintered body to machining such as cutting. Therefore, as the method of forming to obtain the formed body, the injection forming method by which a formed body having a desired shape is readily obtained is preferred.

Heating Step

In a case in which the kneaded product is formed to obtain a formed body, the method for manufacturing a sintered body may include heating the kneaded product being formed. When heating is implemented, the method preferably includes heating in a range from 400° C. to 700° C. in an atmosphere including nitrogen. Heating in an atmosphere including nitrogen in the range from 400° C. to 700° C. reduces the amount of carbon included in the formed body and facilitates degreasing. This makes it possible to suppress a decrease in yield caused by the cracking of the sintered body due to the carbon remaining in the kneaded product. Further, oxidation of the sintered body can be suppressed. Further, depending on the type of organic substance, the temperature of the formed body may rapidly be elevated in the temperature range described above, but heating in an atmosphere including nitrogen makes it possible to suppress such a rapid increase in temperature. As a result, deterioration of the furnace can be suppressed. In this specification, an atmosphere including nitrogen refers to a case in which the amount of nitrogen is at least a vol % of the nitrogen included in the atmosphere. The nitrogen in the atmosphere including nitrogen need only be 80 vol % or greater, preferably 90 vol % or greater, more preferably 99 vol % or greater, and even more preferably 99.9 vol % or greater. The content of oxygen in the atmosphere including nitrogen may be in a range from 0.01 vol % to 20 vol %, and may be in a range from 0.1 vol % to 10 vol %. The atmospheric pressure at which the heating is performed is, for example, ambient pressure. Furthermore, the heating may be performed under a pressurized environment or a depressurized environment. Further, degreasing can be performed by using a known method. The carbon amount in the formed body obtained by degreasing the formed kneaded product is preferably 1000 ppm or less, and more preferably 500 ppm or less. The carbon amount of the formed body after degreasing can be measured, for example, by a non-dispersive infrared absorption method (NDIR). The degreasing time during which heating is performed need only be a time that allows the organic substance in the kneaded product to be degreased, bringing the carbon amount in the formed kneaded product to 1000 ppm or less. Specifically, the time during which heating is performed for degreasing (holding time of maximum temperature) is preferably in a range from 0.1 hours to 50 hours, and is changed as appropriate depending on the shape of the sintered body to be degreased.

Formed Body Firing Step

The method for manufacturing a sintered body includes firing the formed body at a temperature in a range from 1700° C. to 2050° C. to obtain the sintered body. By firing the formed body at a temperature in the range from 1700° C. to 2050° C., the aluminum nitride particles can be densely bonded to each other by the liquid phase formed between the aluminum nitride particles, and a sintered body having high thermal diffusivity and good heat dissipation can be obtained. When the compound including europium is, for example, europium oxide, oxide formed on the surface of the aluminum nitride reacts with the europium oxide to generate the liquid phase. Further, by firing, the europium enters the aluminum nitride particles as well and the europium present in the aluminum nitride particles becomes a light emission center, resulting in a sintered body that emits green light when excited by an excitation light source. When the temperature at which the formed body is fired is less than 1700° C., densification of the aluminum nitride particles due to the firing is less likely to proceed, reducing the thermal diffusivity of the sintered body. As a result, the thermal conductivity of the sintered body decreases. When the temperature at which the formed body is fired exceeds 2050° C., the liquid phase generated between the aluminum nitride particles evaporates. As a result, a mechanical strength of the obtained sintered body may be reduced. Further, the formed body is preferably fired at a temperature in a range from 1750° C. to 2050° C., more preferably in a range from 1800° C. to 2050° C., and even more preferably in a range from 1850° C. to 2050° C. As long as in the temperature ranges described above, a sintered body having even better heat dissipation can be obtained.

The atmosphere in which the formed body is fired is preferably an atmosphere including nitrogen. By firing in an atmosphere including nitrogen, it is less likely that the aluminum nitride will decompose. As a result, the thermal diffusivity of the sintered body is improved, and a sintered body having high thermal conductivity is obtained. Further, preferably a gas including nitrogen is continuously or intermittently supplied to stably maintain the atmosphere including nitrogen as the atmosphere for firing the formed body.

The pressure for firing the formed body is, for example, around atmospheric pressure (101.32 kPa), and is preferably 50 kPa or less by gauge pressure. An environment in a range from 0 kPa to 50 kPa by gauge pressure can be relatively easily reached, and thus productivity is improved.

The firing time need only be the time for obtaining a dense sintered body. Specifically, the firing time is preferably in a range from 0.5 hours to 30 hours, more preferably in a range from 0.5 hours to 15 hours, and even more preferably in a range from 0.5 hours to 5 hours.

To reduce the oxygen amount in the sintered body, preferably a carbon furnace that uses carbon as an internal furnace material, such as for a heating element or a heat insulating material, is used for firing the formed body. A furnace other than a carbon furnace may be used as long as the firing temperature can be maintained.

A setter and crucible on/in which the formed body is placed are preferably ones that are not deformed or degraded by the firing temperature. The material of the setter or the crucible is preferably a nitride such as boron nitride or aluminum nitride. Preferably a setter or a crucible made of a material including at least 95 mass % of high-purity nitride is used.

The sintered body obtained upon removal from the furnace includes the aluminum nitride and the europium, has a thermal diffusivity of 27.0 mm$^2$/s or greater as measured by a laser flash method at 25° C., and emits green light when excited by an excitation light source.

The sintered body may further include a dividing step. The shape of the sintered body after being divided into individual pieces in plan view may be, for example, a substantially rectangular shape, a substantially square shape, a substantially triangular shape, or another polygonal shape.

Light Emitting Device

The light emitting device includes the sintered body and an excitation light source. The light emitting device emits at least green light emitted from the sintered body excited by the excitation light source to the outside. The light emitting device may emit a mixed color light including light from the excitation light source and green light emitted from the sintered body excited by the excitation light source to the outside.

Light Emitting Device Using LED Element

As the excitation light source, a light emitting element having a light emission peak wavelength in a range from 200 nm to 480 nm can be used. The light emitting element may be a semiconductor light emitting element having a light emission peak wavelength in the range from 200 nm to 480 nm. The light emitting element may be a light emitting diode element (hereinafter also referred to as "LED element").

Figure 2:
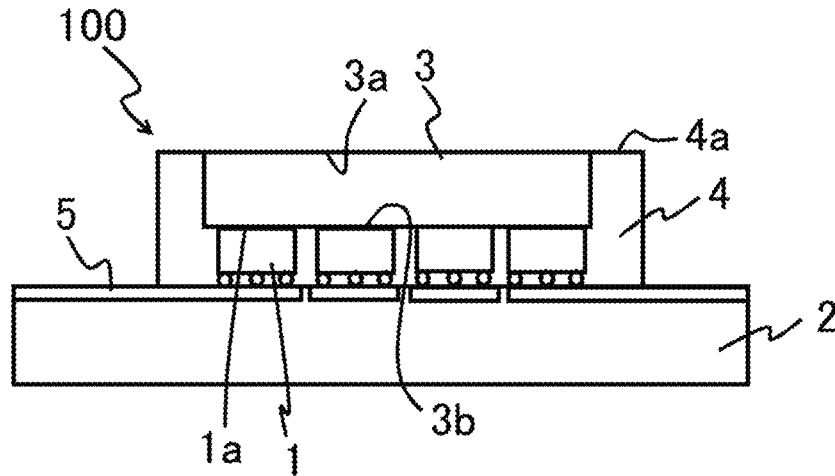
FIG. 2 is a schematic cross-sectional view illustrating an example of a light emitting device that uses an LED element.

An example of a light emitting device that uses an LED element will now be described with reference to the drawings. FIG. 2 is a schematic cross-sectional view of a light emitting device 100.

Light Emitting Element

The light emitting device 100 includes a wiring line 5 on a substrate 2, and an LED element 1 is disposed on the wiring line 5. Note that the wiring line 5 may include an anode and a cathode. The LED element 1 can be selected in accordance with a light emission color, a wavelength, a size, a quantity, and a purpose. For example, a nitride semiconductor ($In_XAl_YGa_{1-X-Y}N$, $0 \leq X$, $0 \leq Y$, $X+Y \leq 1$) can be used as the semiconductor light emitting element having a light emission peak wavelength in the range from 200 nm to 480 nm. As the LED element 1, an element that includes a positive and negative pair of electrodes on the same surface side can be used. The LED element 1 is, for example, flip-chip mounted onto the wiring line 5 by a bump. When the LED element 1 is flip-chip mounted onto the wiring line 5, the surface located opposite to the surface on which the pair of electrodes is formed is a light extraction surface. Note that there may be one LED element 1 per light emitting device.

Substrate

Examples of the material of the substrate 2 include an insulating member such as glass epoxy, resin, and ceramic, and a metal member including an insulating member.

Examples of the ceramic include aluminum oxide and aluminum nitride. The ceramic may be combined with, for example, an insulating material such as a BT resin, a glass epoxy, or an epoxy resin. The substrate 2 preferably includes the wiring line 5 that is disposed on a surface thereof and connected to the LED element 1.

Sintered Body

A sintered body 3 can cover one surface Ta, which is a light extraction surface of the LED element 1. For example, one surface 3b of the sintered body 3 may cover the one surface Ta of the LED element 1. When the sintered body 3 covers the one surface Ta, which is the light extraction surface of the LED element 1, the sintered body 3 is excited by light emitted from the LED element 1 and green light is emitted from the sintered body 3. Further, the sintered body 3 having high thermal diffusivity and high thermal conductivity can efficiently dissipate heat from the sintered body 3 to outside the light emitting device 100. The sintered body 3 may be in contact with the one surface 1a, which is the light extraction surface of the LED element 1, and may be bonded by a known method such as an adhesive or a direct bonding method. A thickness of the sintered body 3 used in the light emitting device 100 is, for example, in a range from 50 μm to 500 μm, may be in a range from 60 μm to 450 μm, and may be in a range from 70 μm to 400 μm. In a case in which a plurality of the LED elements 1 are aligned, a size of the sintered body 3 need only be a size that covers all light extraction surfaces of the LED elements 1.

Light Reflecting Member

The light emitting device 100 may include a light reflecting member 4 around the LED element 1 and the sintered body 3. The light reflecting member 4 preferably surrounds both the LED element 1 and the sintered body 3. The one surface 1a of the LED element 1 facing the one surface 3b of the sintered body 3 covering the one surface 1a of the LED element 1 is preferably not covered by the light reflecting member 4. One surface 3a of the sintered body 3 may be flush with one surface 4a of the light reflecting member 4, or may protrude from the one surface 4a of the light reflecting member 4.

The light reflecting member 4 preferably includes a reflective substance and at least one type of resin selected from the group consisting of silicone resin, modified silicone resin, epoxy resin, modified epoxy resin, acrylic resin, and a mixture of two or more of these. As the reflective substance, at least one material selected from the group consisting of titanium oxide, silicon oxide, zirconium oxide, potassium titanate, aluminum oxide, aluminum nitride, boron nitride, and mullite can be used.

Light Emitting Device Using LD Element

Figure 3:
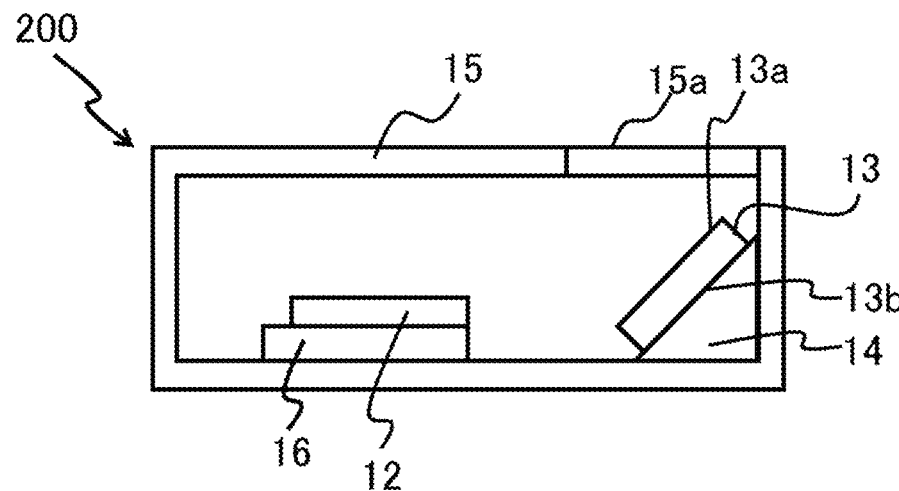
FIG. 3 is a schematic cross-sectional view illustrating an example of an embodiment of a light emitting device that uses the LD element.

Next, a first embodiment of a light emitting device that uses a semiconductor laser element (hereinafter referred to as "LD element") will be described on the basis of the drawings. FIG. 3 is a schematic cross-sectional view of a light emitting device 200.

Semiconductor Laser Element

As the excitation light source, an LD element can be used. Examples of the LD element include an element having a layered structure of a semiconductor such as a nitride semiconductor ($In_XAl_YGa_{1-X-Y}N$, $0{\leq}X$, $0{\leq}Y$, $X+Y{\leq}1$). An oscillation wavelength of the LD element can be adjusted by adjusting the composition. For example, an LD element having an oscillation wavelength peak in a range from 200 nm to 480 nm may be used. From the perspective of efficient excitement of the sintered body, an LD element having an oscillation wavelength peak in a range from 300 nm to 450 nm, for example, is used. An LD element having an oscillation wavelength peak preferably in a range from 330 nm to 450 nm, more preferably in a range from 340 nm to 430 nm, is used. Particularly preferably, an LD element having an oscillation wavelength peak in a range from 360 nm to 420 nm is used. Within this range, the strength of an excitation spectrum of the sintered body is 80% or greater, making it possible to efficiently increase the luminous intensity of the sintered body. A half value width of the light emission peak in the light emission spectrum of the LD element is, for example, 5 nm or less, preferably 3 nm or less. Half value width in this specification refers to full width at half maximum (FWHM).

The light emitting device may include a plurality of LD elements. The light emitting device 200 includes a first LD element, a second LD element 12, and a sintered body 13 in a package member 15. The sintered body 13 is disposed at a position irradiated with the laser light emitted from the first LD element and the second LD element 12 directly or via an optical member or the like.

The first LD element, the second LD element 12, and the sintered body 13 are preferably disposed at positions separated from each other. This allows the heat dissipation path of the heat dissipated from each member to be a separate path, and the heat to be efficiently dissipated from each member.

Submount

The first LD element and the second LD element 12 may be disposed on the package member 15 directly or with a submount 16 interposed therebetween. Examples of a material of the submount 16 include aluminum nitride, silicon carbide, a composite material of copper and diamond, and a composite material of aluminum and diamond. The composite material of copper and diamond and the composite material of aluminum and diamond include diamond and thus have good heat dissipation.

Sintered Body

The sintered body 13 has high thermal diffusivity and high thermal conductivity, making it possible to dissipate the heat from the light emitted from the first LD element and the second LD element 12, reduce the decrease in luminous efficiency caused by temperature rise, and emit green light.

The first LD element and the second LD element 12 are disposed on a first main surface 13a side of the sintered body 13, and the first main surface 13a of the sintered body 13 is directly irradiated with light emitted from the first LD element and the second LD element 12. Of the sintered body 13, the first main surface 13a irradiated with light may be the light extraction surface, or a second main surface 13b facing the first main surface 13a may be the light extraction surface.

Further, the sintered body 13 may be provided with a light reflecting film and/or a light reflecting member 14 in contact or not in contact with a surface other than the light incident surface and/or the light extraction surface. For example, in a case in which the light reflected by the sintered body 13 is intended to extract, the light reflecting film and/or the light reflecting member 14 can be disposed on a surface of the sintered body on a side opposite to the surface on which the excitation light is incident and from which light is extracted. The light reflecting film and/or the light reflecting member 14 preferably has a reflectivity of 60% or greater relative to the emitted laser light and/or the light emitted from the sintered body, and may have a reflectivity of 90% or greater.

A shape of the sintered body 13 may be, for example, a plate shape. The plate-shaped member includes two flat surfaces parallel with and facing each other. A thickness of the sintered body 13 may be in a range from 50 μm to 1000 μm, may be in a range from 50 μm to 500 μm, or may be in a range from 80 μm to 350 μm, taking into consideration heat dissipation and handling characteristics. Further, the thickness of the sintered body 13 may partially vary.

Package Member

The sintered body 13 may be in contact with the package member 15. In a case in which the sintered body 13 is in contact with the package member 15, heat is transferred from the sintered body 13 having high thermal diffusivity and good thermal conductivity to the package member 15, and the heat inside the package member 15 can be efficiently dissipated to outside the package member 15. The sintered body 13 may be disposed in the package member 15, and may be disposed at a position that blocks a light extraction window of the package member 15. The sintered body 13 may constitute a portion of the package member 15 as the light extraction window of the package member 15. A light extraction window 15a of the package member 15 can be formed of, for example, glass or sapphire.

The first LD element, the second LD element 12, and the sintered body 13 are disposed in the package member 15, and these members are preferably hermetically sealed in the package member 15. When these members are hermetically sealed in the package member 15, dust collection due to laser light emitted from the first LD element and the second LD element 12 can be suppressed.

The package member 15 is preferably formed using a material having favorable heat dissipation, such as, for example, a metal including copper, a copper alloy, or an iron alloy, or a ceramic including aluminum nitride, aluminum oxide, or the like. The package member 15 may be constituted by a base and a cap, for example. An interior of the package member 15 may be hermetically sealed. A shape of the base and/or cap that constitute the package member 15 may have a variety of shapes such as a planar shape that is substantially circular, substantially elliptical, or substantially polygonal, for example.

In the light emitting device, a lens such as a focusing lens may be disposed between the LD element and the sintered body and/or on the path of the light from the sintered body. This makes it possible to control an irradiation range of the light from the LD element and/or the light from the sintered body.

Figure 4:
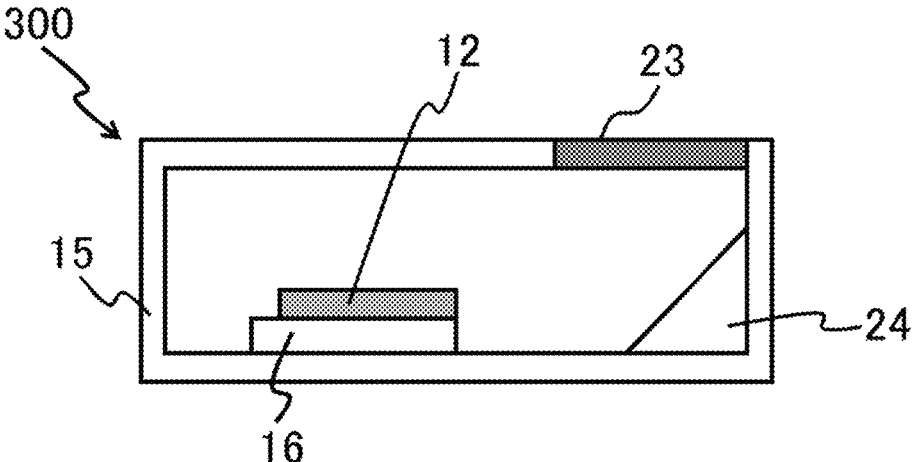
FIG. 4 is a schematic cross-sectional view illustrating an example of an embodiment of a light emitting device that uses the LD element.

As illustrated in FIG. 4, in a light emitting device 300 according to a second embodiment, a sintered body 23 is a plate-shaped member and fits in the light extraction window of the package member 15. Then, a light reflecting member 24 is disposed with one surface being a surface having an angle of 45 degrees relative to the path of the light emitted from the first LD element and the second LD element 12, causing the reflected light to be incident on the sintered body 23. Apart from these configurations, the second embodiment has substantially the same as or similar to configuration as that of the light emitting device 200 of the first embodiment.

Note that the light emitting device according to the present embodiment is not limited to the light emitting device described above. For example, the light emitting device may be a light emitting device that is provided with a sintered body outside the package including the light emitting element to perform wavelength conversion.

EXAMPLES

The present invention will be described in detail hereinafter using examples. However, the present invention is not limited to these examples.

Example 1

Powdered aluminum nitride (AlN) and powdered europium oxide ($Eu_2O_3$) were dry mixed to obtain a raw material mixture. Aluminum nitride particles were included in an amount of 98 mass % and europium oxide particles were included in an amount of 2 mass %, relative to the total amount of the raw material mixture. A central particle size of the aluminum nitride particles was 1.7 μm, and a central particle size of the europium oxide particles was 3.0 μm. Further, the particle size ratio De/Da of the central particle size De of the europium oxide particles to the central particle size Da of the aluminum nitride particles was 1.76. 15 parts by mass of paraffin wax were added as a binder per 100 parts by mass of the raw material mixture, and the mixture was kneaded using a kneader to obtain a kneaded product. The kneaded product was fed into an injection forming machine, and the kneaded product was formed into a shape having a size of 13 mm (length)×13 mm (width)×3 mm (thickness). The formed kneaded product was heated and degreased in a nitrogen flowing atmosphere (nitrogen gas 99 vol %) at 500° C. under atmospheric pressure (101.32 kPa) for 3 hours to obtain a formed body. The carbon amount in the formed body was 500 ppm or less. The obtained formed body was placed on a setter made of boron nitride, which was placed in a crucible made of boron nitride, inserted into a carbon furnace that used carbon as an inner furnace material of the heating element or insulating material, and fired in an atmosphere including nitrogen (nitrogen gas 100 vol %) at 1800° C. under atmospheric pressure (101.32 kPa) for 1 hour to obtain a sintered body.

Example 2

A sintered body was obtained in that was the same as or similar to the manner as in example 1 with the exception that the raw material mixture was obtained by dry mixing 95 mass % of powdered aluminum nitride and 5 mass % of powdered europium oxide.

Example 3

A sintered body was obtained in that was the same as or similar to the manner as in example 1 with the exception that the raw material mixture was obtained by dry mixing 90 mass % of powdered aluminum nitride and 10 mass % of powdered europium oxide.

Example 4

A sintered body was obtained in that was the same as or similar to the manner as in example 1 with the exception that the firing temperature was 1900° C.

Example 5

A sintered body was obtained in that was the same as or similar to the manner as in example 2 with the exception that the firing temperature was 1900° C.

Example 6

A sintered body was obtained in that was the same as or similar to the manner as in example 3 with the exception that the firing temperature was 1900° C.

Example 7

A sintered body was obtained in that was the same as or similar to the manner as in example 1 with the exception that the firing temperature was 2000° C.

Example 8

A sintered body was obtained in that was the same as or similar to the manner as in example 2 with the exception that the firing temperature was 2000° C.

Example 9

A sintered body was obtained in that was the same as or similar to the manner as in example 3 with the exception that the firing temperature was 2000° C.

Example 10

A sintered body was obtained in that was the same as or similar to the manner as in example 1 with the exception that the raw material mixture was obtained by dry mixing 95 mass % of powdered aluminum nitride, 4 mass % of powdered europium oxide, and 1 mass % of powdered yttrium oxide ($Y_2O_3$) particles (central particle size: 1.7 μm).

Example 11

A sintered body was obtained in that was the same as or similar to the manner as in example 1 with the exception that the firing temperature was 1700° C.

Comparative Example 1

A sintered body was obtained in that was the same as or similar to the manner as in example 1 with the exception that the raw material mixture was obtained by dry mixing 95 mass % of powdered aluminum nitride and 5 mass % of yttrium oxide (central particle size: 1.7 μm).

Comparative Example 2

A sintered body was obtained in that was the same as or similar to the manner as in example 1 with the exception that 100 mass % of powdered aluminum nitride was fired.

The following evaluations were conducted on the raw materials, formed kneaded products, and each sintered body according to the examples and comparative examples. The evaluation results are shown in the specification and in Tables 1 and 2.

Central Particle Size

For the aluminum nitride, europium oxide, and yttrium oxide raw materials, the central particle size corresponding to 50% in the volume-based cumulative particle size distribution was measured by the Coulter counter method using a particle size distribution measurement device (CMS, Beckman Coulter, Inc.).

Carbon Amount Measurement

The carbon amount of each formed kneaded product was determined using a non-dispersive infrared absorption method.

Apparent Density

For each 10 mm (length)×10 mm (width)×2 mm (thickness) sample of each sintered body according to all examples and all comparative examples, the mass and the volume were measured and the apparent density was calculated on the basis of equation (1) described above. The volume was measured by the Archimedes method.

Thermal Diffusivity

For each 10 mm (length)×10 mm (width)×2 mm (thickness) sample of each sintered body according to all examples and all comparative examples, the thermal diffusivity $\alpha$ of each sintered body was measured at 25° C. by a laser flash method using a laser flash analyzer (LFA 447 manufactured by NETZSCH GmbH & Co.).

Thermal Conductivity

For each sample of each sintered body according to the examples and the comparative examples, the thermal conductivity $\kappa$ was calculated on the basis of the measured apparent density and thermal diffusivity a, and the specific heat capacity Cp of the sintered body. The specific heat capacity Cp was calculated as 0.72 KJ/kg·K, which is the specific heat capacity of aluminum nitride.

Amount of Europium in Sintered Body

The amount of europium in each sintered body according to example 1 to example 7 and example 11 was measured by the following method. The amount of europium in the sintered body was measured by an inductively coupled high-frequency plasma atomic emission spectrometry (ICP-AES) system after acidolysis of the sintered body.

Relative Value Rd Based on Apparent Density of Sintered Body

From the value of the apparent density of each sintered body according to all examples and all comparative examples, a relative value Rd based on the apparent density was calculated on the basis of the equations (3) and (4) below.

[Equation 3]

$$\text{Relative value Rd based on apparent density} \ldots \text{apparent density of sintered body÷theoretical density of raw material mixture} \quad (3)$$

[Equation 4]

$$\text{Theoretical density of raw material mixture}=(\text{AlN mass}+\text{Eu}_2\text{O}_3 \text{ mass})÷[\text{AlN content in raw material mixture}/3.26+\text{Eu}_2\text{O}_3 \text{ content in raw material mixture}/7.42] \quad (4)$$

Note that "3.26" in equation (4) represents the theoretical density of aluminum nitride (AlN), and "7.42" represents the theoretical density of europium oxide ($\text{Eu}_2\text{O}_3$).

Relative Value Re of Measured Europium Amount Relative to Europium Amount in Raw Material Mixture A relative value Re of the europium amount in the sintered body relative to the europium amount in the raw material mixture was calculated by equation (5) below.

[Equation 5]

$$\text{Relative value Re of Eu amount in sintered body}=\text{Eu amount in sintered body}÷\text{Eu}_2\text{O}_3 \text{ content in raw material mixture}×0.8631 \quad (5)$$

Note that "0.863" represents the theoretical value of the europium (Eu) amount included in the europium oxide ($\text{Eu}_2\text{O}_3$).

Light Emission Color and Light Emission Spectrum

Figure 5:
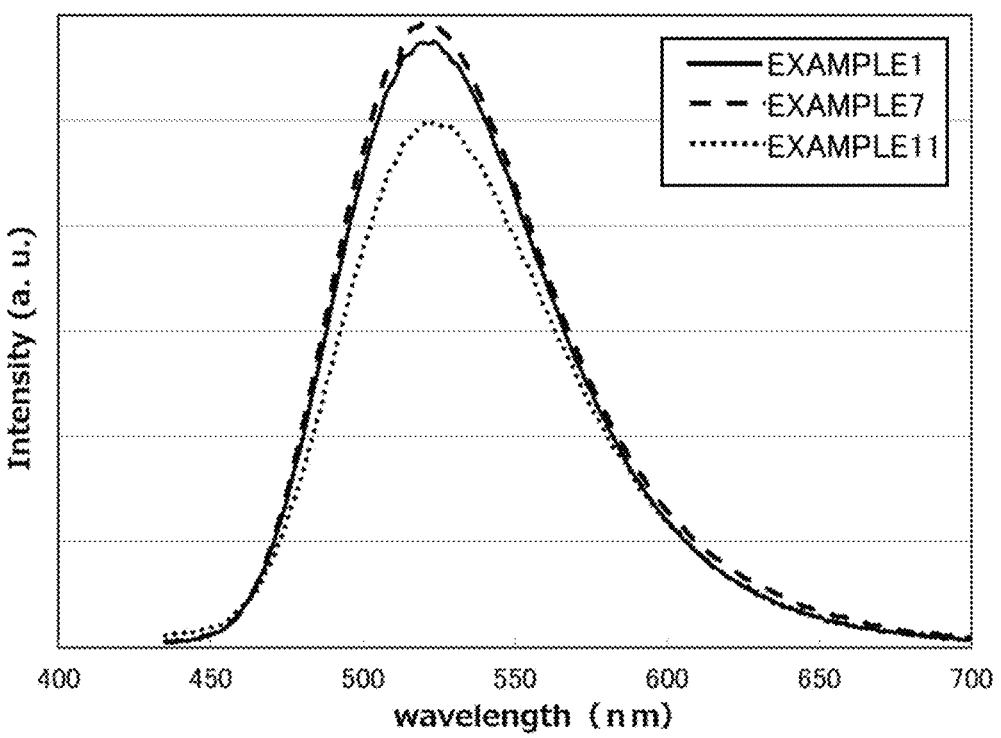
FIG. 5 is a diagram showing light emission spectra when sintered bodies according to example 1, example 7, and example 11 were excited by a light source having a light emission peak wavelength of 365 nm.
Figure 6:
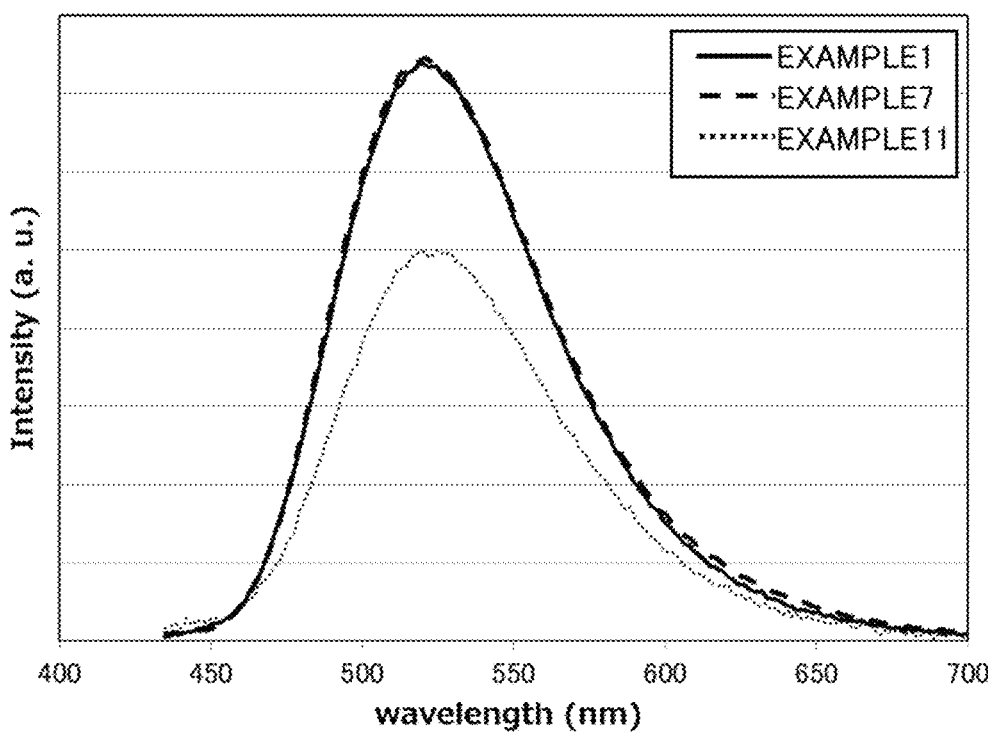
FIG. 6 is a diagram showing light emission spectra when the sintered bodies according to example 1, example 7, and example 11 were excited by a light source having a light emission peak wavelength of 400 nm.
Figure 12:
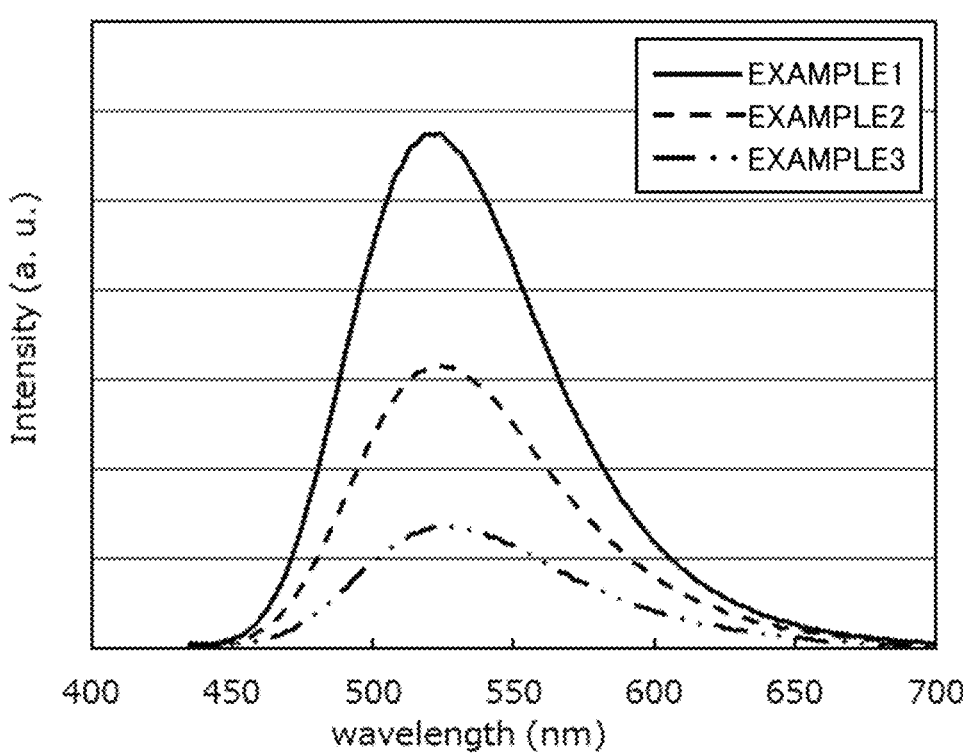
FIG. 12 is a diagram showing light emission spectra when the sintered bodies according to example 1, example 2, and example 3 were excited by a light source having a light emission peak wavelength of 365 nm.
Figure 13:
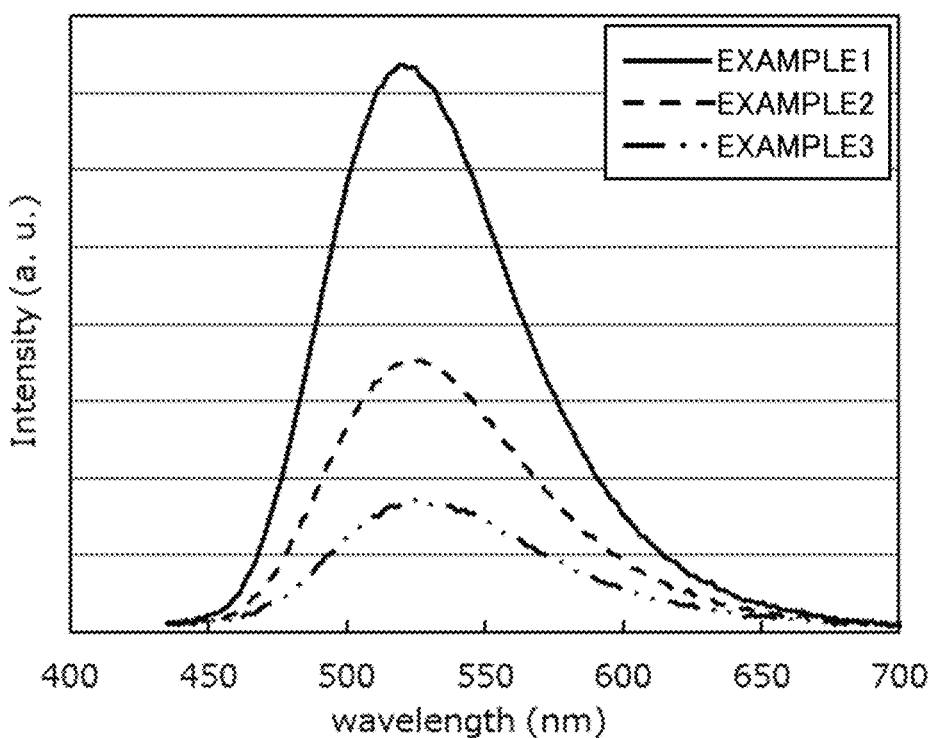
FIG. 13 is a diagram showing light emission spectra when the sintered bodies according to example 1, example 2, and example 3 were excited by a light source having a light emission peak wavelength of 400 nm.

The samples of each sintered body according to all examples and all comparative examples were each irradiated with excitation light having light emission peak wavelengths of 365 nm and 400 nm as the excitation light source, and the light emission color of each sintered body was confirmed. Using a quantum efficiency measurement device (QE-2000 manufactured by Otsuka Electronics Co., Ltd.), each sample was irradiated with the excitation light having light emission peak wavelengths of 365 nm and 400 nm, the light emission spectra were measured at room temperature (25° C.±5° C.), and the wavelength at which the light emission spectrum of the sintered body was greatest was measured as the light emission peak wavelength (nm) of the sintered body. The light emission peak wavelengths of the sintered bodies exhibited substantially the same light emission peak wavelength when the light emission peak wavelength of the excitation light was 365 nm and 400 nm. The light emission spectra of the sintered bodies according to example 1, example 7, and example 11 when irradiated with excitation light having a light emission peak wavelength of 365 nm are shown in FIG. 5. The light emission spectra of the sintered bodies according to example 1, example 7, and example 11 when irradiated with excitation light having a light emission peak wavelength of 400 nm are shown in FIG. 6. The light emission spectra of the sintered bodies according to example 1, example 2, and example 3 when irradiated with excitation light having a light emission peak wavelength of 365 nm are shown in FIG. 12. The light emission spectra of the sintered bodies according to example 1, example 2, and example 3 when irradiated with excitation light having a light emission peak wavelength of 400 nm are illustrated in FIG. 13. The light emission peak wavelengths of the sintered bodies were confirmed to have light emission peak wavelengths in a range from 500 nm to 550 nm and to be that of green light, whether the light emission peak wavelength of the excitation light was 365 nm or 400 nm.

Excitation Spectrum

Figure 7:
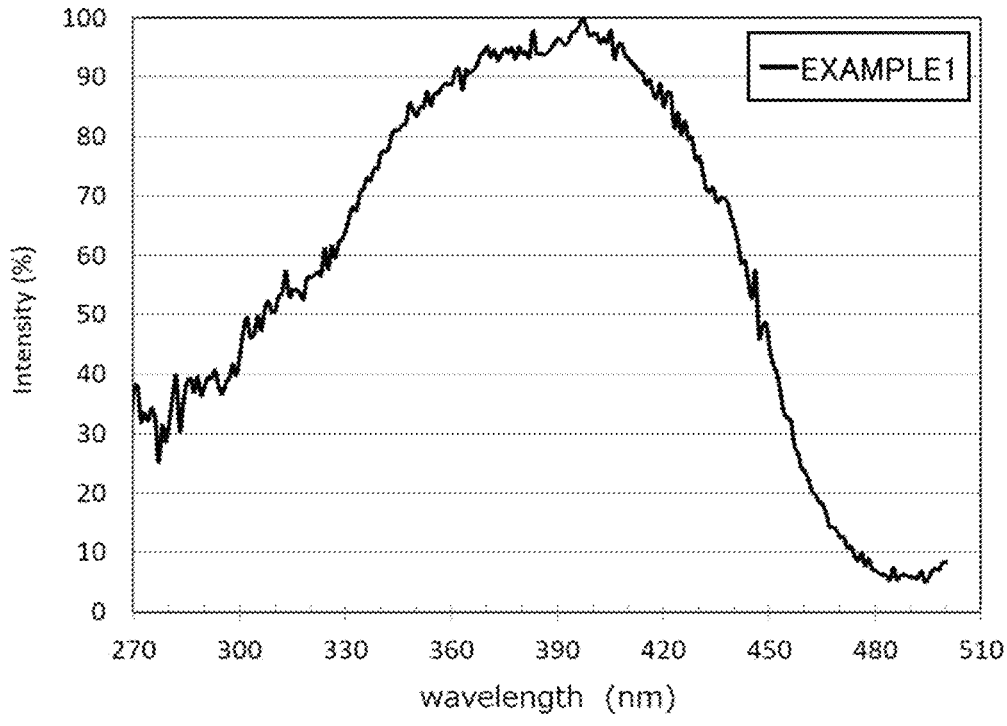
FIG. 7 is a diagram showing an excitation spectrum of the sintered body according to example 1.

The excitation spectrum of the sintered body according to example 1 was measured using a fluorescence spectrophotometer (F-4500 manufactured by Hitachi High-Tech Science Corporation). The results are shown in FIG. 7.

TABLE 1

| | Raw material mixture | | | Firing | Sintered body | | | | | |
| | | | | | Eu amount in sintered body (wt %) | Light emission color by 365 nm excitation | Light emission color by 400 nm excitation | Apparent density (g/cm$^3$) | Thermal diffusivity (mm$^2$/s) | Thermal conductivity apparent density (W/m · K) |
| | AlN (%) | Y$_2$O$_3$ (%) | Eu$_2$O$_3$ (%) | temperature (° C.) | | | | | | |
|---|---|---|---|---|---|---|---|---|---|---|
| Example 1 | 98 | 0 | 2 | 1800 | 1.6 | Green | Green | 3.26 | 53.3 | 125 |
| Example 2 | 95 | 0 | 5 | 1800 | 3.1 | Green | Green | 3.21 | 61.4 | 142 |
| Example 3 | 90 | 0 | 10 | 1800 | 4.6 | Green | Green | 2.99 | 53.0 | 114 |
| Example 4 | 98 | 0 | 2 | 1900 | 1.4 | Green | Green | 3.28 | 65.6 | 155 |
| Example 5 | 95 | 0 | 5 | 1900 | 2.7 | Green | Green | 3.29 | 66.3 | 157 |
| Example 6 | 90 | 0 | 10 | 1900 | 4.4 | Green | Green | 3.26 | 60.1 | 141 |
| Example 7 | 98 | 0 | 2 | 2000 | 0.5 | Green | Green | 3.26 | 69.4 | 163 |
| Example 8 | 95 | 0 | 5 | 2000 | | Green | Green | 3.28 | 70.3 | 166 |
| Example 9 | 90 | 0 | 10 | 2000 | | Green | Green | 3.27 | 66.3 | 156 |
| Example 10 | 95 | 1 | 4 | 1800 | | Green | Green | 3.31 | 63.4 | 151 |
| Example 11 | 98 | 0 | 2 | 1700 | 1.7 | Green | Green | 3.16 | 27.1 | 62 |
| Comparative example 1 | 95 | 5 | 0 | 1800 | | No light emission | No light emission | 3.31 | 71.3 | 170 |
| Comparative example 2 | 100 | 0 | 0 | 1800 | | No light emission | No light emission | 2.90 | 22.8 | 48 |

TABLE 2

| | Relative value Rd | Relative value Rd |
|---|---|---|
| Example 1 | 0.99 | 0.93 |
| Example 2 | 0.96 | 0.72 |
| Example 3 | 0.87 | 0.53 |
| Example 4 | 0.99 | 0.81 |
| Example 5 | 0.98 | 0.63 |
| Example 6 | 0.94 | 0.51 |
| Example 7 | 0.99 | 0.29 |
| Example 8 | 0.98 | |
| Example 9 | 0.95 | |
| Example 10 | 0.99 | |
| Example 11 | 0.96 | 0.98 |
| Comparative example 1 | 1.00 | |
| Comparative example 2 | 0.89 | |

The sintered bodies according to example 1 to example 11 each had a thermal diffusivity of 27.0 mm$^2$/s or greater as measured by the laser flash method at 25° C. Further, the sintered bodies according to example 1 to example 11 each emitted green light upon excitation by the excitation light, whether the light emission peak wavelength was 365 nm or 400 nm.

In example 1 to example 3 and example 4 to example 6, the content of europium included in each sintered body increased when the content of europium included in the raw material mixture increased, even at the same firing temperature. On the other hand, the relative value Re of the amount of europium in the sintered body relative to the amount of europium included in the raw material mixture decreased as the amount of europium included in the raw material mixture increased. From this result, it was inferred that the amount of volatilized europium increases as the amount of europium included in the raw material mixture increases, even if the firing temperature is the same. The relative value Rd based on the apparent density of the sintered body did not significantly change by changes in the content of europium oxide (Eu$_2$O$_3$) in the raw material mixture, confirming that high density was maintained.

The sintered bodies according to comparative example 1 and comparative example 2 did not include europium oxide in the raw material mixture, lacked the presence of the europium serving as the light emission center in the aluminum nitride, and thus did not emit light even when irradiated with the excitation light having light emission peak wavelengths of 365 nm and 400 nm from the excitation light source.

Further, the sintered body according to comparative example 2 did not include europium oxide or yttrium oxide that serves as a sintering aid in the raw material mixture, and thus the apparent density was low compared to those of the sintered bodies according to examples 1 to 11, resulting in a low thermal diffusivity of less than 27.0 mm$^2$/s.

Compared to example 1, the sintered body according to example 11 had a difference in thermal diffusivity even though the apparent densities of the two were close in value. Therefore, each bulk density of the sintered body according to example 1 and the sintered body according to example 11 was measured by the method below and a relative value Rb based on bulk density was calculated on the basis of equation (6). Table 3 shows the apparent densities of the sintered bodies and the relative values Rd based on the apparent densities of the sintered bodies, the bulk densities and the relative values Rb based on the bulk densities, and the thermal diffusivity values according to example 1 and example 11. The bulk densities were each found by measuring the length, width, and height dimensions of the sintered body.

[Equation 6]

$$\text{Relative value Rb based on bulk density} = \text{bulk density of sintered body} \div \text{theoretical density of raw material mixture} \tag{6}$$

TABLE 3

| | Apparent density (g/cm$^3$) | Relative value Rd based on apparent density | Bulk density (g/cm$^3$) | Relative value Rb based on bulk density Rb | Thermal diffusivity (mm$^2$/s) |
|---|---|---|---|---|---|
| Example 1 | 3.26 | 0.99 | 3.26 | 0.99 | 53.3 |
| Example 11 | 3.16 | 0.96 | 2.41 | 0.73 | 27.1 |

The bulk density of the sintered body according to example 1 having a thermal diffusivity of 53.3 mm$^2$/s was 3.26 g/cm³. The bulk density of the sintered body according to example 11 fired at a temperature of 1700° C. and having a thermal diffusivity of 27.1 mm²/s was 2.41 g/cm³. The sintered body according to example 1 showed no numerical change in apparent density and bulk density. On the other hand, the sintered body according to example 11 had a bulk density lower than the apparent density. The sintered body according to example 1 was confirmed to be a dense sintered body compared to the sintered body according to example 11.

As shown in FIGS. 5 and 6, the sintered bodies according to example 1, example 7, and example 11 each had a light emission peak wavelength in the light emission spectrum of 523 nm. That is, the light emission peak wavelength was in the green light wavelength range from 500 nm to 550 nm, confirming the emission of green light.

As illustrated in FIGS. 12 and 13, whether the excitation wavelength was 365 nm or 400 nm, it was confirmed that the intensity of the light emission peak wavelength of the sintered body according to example 1 was higher than those of example 2 and example 3. In the sintered body according to example 1, the content of europium oxide relative to the entire raw material mixture in the production process was less than those of example 2 and example 3. Thus, conceivably a decrease in thermal conductivity of the sintered body in example 1 was suppressed, making it possible to increase the intensity of the light emission peak wavelength to a greater extent than in example 2 and example 3.

X-Ray Diffraction Pattern

Figure 8:
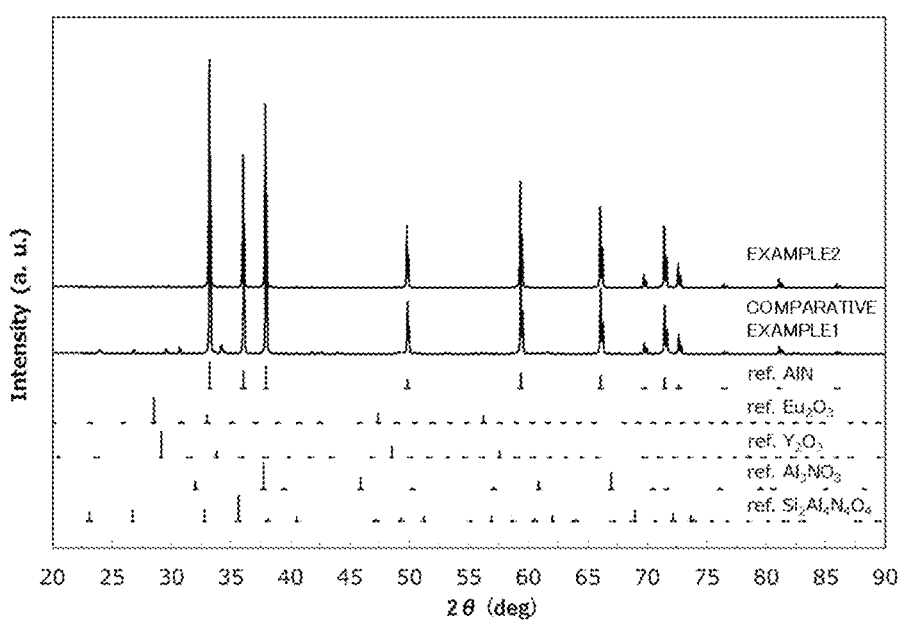
FIG. 8 is a diagram showing each XRD spectrum of a sintered body of example 2, a sintered body of comparative example 1, AlN, $Eu_2O_3$, $Y_2O_3$, $Al_3NO_3$, and $Si_2Al_4O_4N_4$.

The sintered body according to example 2 and the sintered body according to comparative example 1 were subjected to x-ray diffraction pattern measurement using a sample horizontal multipurpose X-ray diffractometer (SmartLab manufactured by Rigaku Corporation) and CuKα radiation ($\lambda$=0.15418 nm, tube voltage 45 kV, tube current 40 mA) as the X-ray source. The obtained X-ray diffraction (XRD) patterns indicating diffraction intensity with respect to the diffraction angle ($2\theta$) are shown in FIG. 8. FIG. 8 shows the X-ray diffraction pattern of the sintered body according to example 2 and the X-ray diffraction pattern according to comparative example 1 in this order from the top, and shows the X-ray diffraction (XRD) patterns for AlN, $Eu_2O_3$, $Y_2O_3$, $Al_3NO_3$, and $Si_2Al_4O_4N_4$ registered in the Inorganic Crystal Structure Database (ICSD) in this order from the top as reference examples.

As illustrated in FIG. 8, the XRD patterns of the sintered body according to example 2 and the sintered body according to comparative example 1 have peaks at substantially the same positions as those of the diffraction angles $2\theta$ of the XRD pattern of AlN, confirming that the sintered bodies have substantially the same structure as that of AlN. The sintered body according to example 2 emits green light by excitation of an excitation light source, but the XRD pattern of the sintered body according to example 2 has peaks at positions of diffraction angles $2\theta$ different from those of the XRD pattern of sialon phosphor represented by $Si_2Al_4O_4N_4$, confirming that the sintered body has a structure different from that of $Si_2Al_4O_4N_4$. Further, the XRD pattern of the sintered body according to example 2 has peaks at positions different from those of the diffraction angles $2\theta$ of each XRD pattern of $Eu_2O_3$ and $Y_2O_3$, which are raw materials or sintering aids, confirming that the sintered body has a structure different from those of these compounds. Further, a main peak of the sintered body of example 2 could not be observed at the diffraction angle $2\theta$ of $Al_3NO_3$, a compound composed of aluminum, nitrogen, and oxygen. From this, it is understood that the main portion of the sintered body at least in example 2 consists of AlN particles.

Element Analysis of Sintered Body

Figure 9:
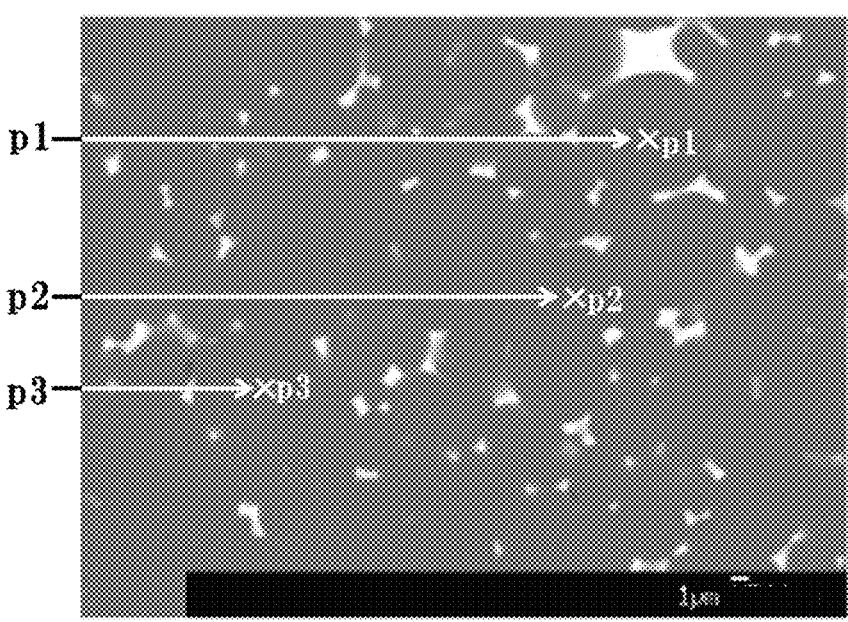
FIG. 9 is an SEM photograph of a backscattered electron image of a partial cross section of the sintered body according to example 5, showing analysis points using EPMA.
Figure 10:
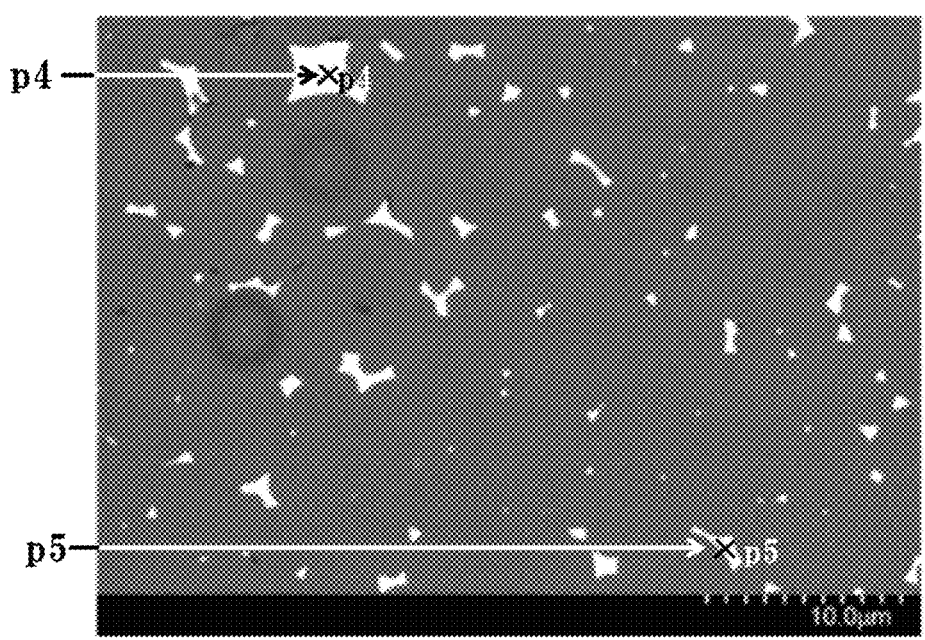
FIG. 10 is an SEM photograph of a backscattered electron image of a partial cross section of the sintered body according to example 5, showing analysis points using EDX.
Figure 11:
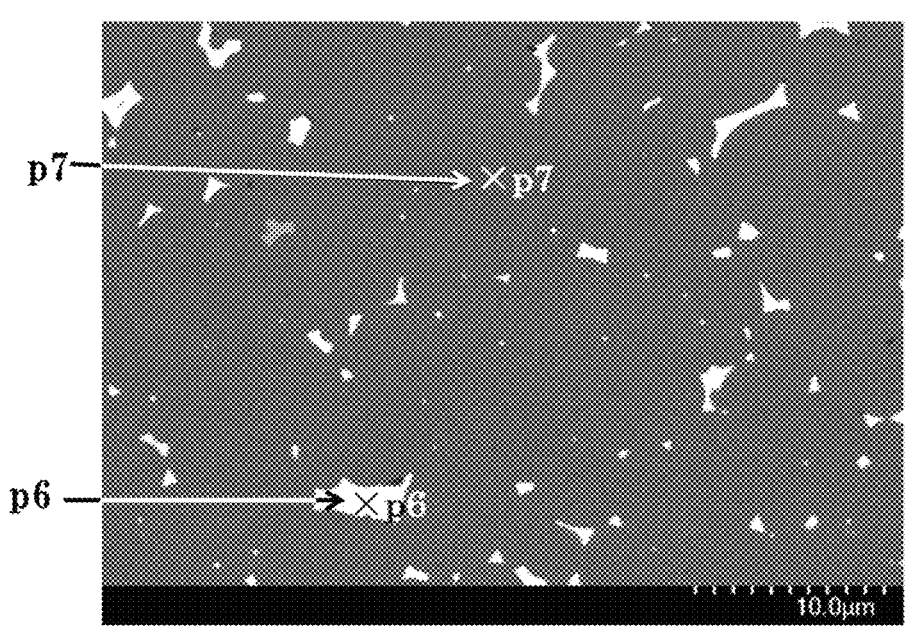
FIG. 11 is an SEM photograph of a backscattered electron image of a partial cross section of the sintered body according to example 5, showing analysis points using EDX.

The surface of the sintered body according to example 5 was finished with a cross-section polisher (CP) and then coated with carbon. Subsequently, a backscattered electron image of a cross section of the sintered body was observed and quantitatively analyzed. Quantitative analysis was performed using an EPMA system (JXA-8500F, JEOL Ltd.) on each element of nitrogen (N), oxygen (O), aluminum (Al), and europium (Eu) at each measurement point of the aluminum nitride particles (also referred to "AlN particles") constituting the base material of the sintered body. The content of each element (mass %) was calculated given 100 mass % as the sum of the analytical values of N, O, Al, and Eu at each measurement point. Results rounded to the third decimal place are shown in Table 4. Note that the total amount of N, O, Al, and Eu may not equal 100 mass % as a result of the rounding. FIG. 9 is an SEM photograph of a backscattered electron image of a cross section of the sintered body according to example 5. In FIG. 9, p1, p2, and p3 indicate points analyzed in the aluminum nitride particles constituting the base material of the sintered body. In FIG. 9, low brightness regions including measurement points p1, p2, and p3 are areas where aluminum nitride particles are positioned, and high brightness regions are the regions between aluminum nitride particles. Table 4 shows the average values of the content of the AlN particles at the measurement points p1, p2 and p3 analyzed by EPMA, and the first ratio $X_1/Y_1$ of the europium amount $X_1$ to the aluminum amount $Y_1$ present in the aluminum nitride particles of the sintered body calculated on the basis of the average values obtained. After the EPMA analysis, the backscattered electron images were observed and semi-quantitative analysis of each O, Al, and Eu element was performed using a SEM-EDX system (SU8230 manufactured by Hitachi, Ltd., SDD detector). The content of each element (mass %) was calculated given 100 mass % as the sum of the analytical values of O, Al, and Eu in and between the aluminum nitride particles at each measurement point. Results rounded to the second decimal place are shown in Table 4. Note that the total amount of O, Al, and Eu in and between the aluminum nitride particles may not equal 100 mass % as a result of the rounding. FIGS. 10 and 11 are SEM photographs of backscattered electron images of different regions of a cross section of the sintered body according to example 5. In FIGS. 10 and 11, p4, p5, and p6 indicate points of element analysis between the aluminum nitride particles of the sintered body. In FIG. 11, p7 indicates a measurement point in the aluminum nitride particles of the sintered body. In FIGS. 10 and 11, the high brightness regions including the measurement points p4, p5 and p6 are regions between the aluminum nitride particles, and the low brightness region including the measurement point p7 is the area where the aluminum nitride particles are positioned. Table 4 shows the average values of the content of each element between the AlN particles at the measurement points p4, p5, and p6 analyzed by EDX, and the second ratio $X_2/Y_2$ of the europium amount $X_2$ to the aluminum amount $Y_2$ present between the aluminum nitride particles of the sintered body calculated on the basis of the average values obtained.

TABLE 4

| Measurement point | | N | O | Al | Eu | $X_1/Y_1$ | $X_2/Y_2$ |
|---|---|---|---|---|---|---|---|
| In AlN | Average | 30.32 | 0.44 | 69.13 | 0.12 | 0.0017 | — |

TABLE 4-continued

| Measurement point | | N | O | Al | Eu | $X_1/Y_1$ | $X_2/Y_2$ |
|---|---|---|---|---|---|---|---|
| particles (EPMA) | value | | | | | | |
| Between AIN particles (EDX) | Average value | — | 14.1 | 8.8 | 77.0 | — | 8.7 |

At three points (p1, p2, and p3) of the backscattered electron image of the cross section of the sintered body according to example 5 shown in FIG. 9, it was confirmed that Eu was also present in the aluminum nitride particles constituting the base material of the sintered body by EPMA measurement. The ratio of the average values of the content of Al and the content of N in the aluminum nitride particles of the sintered body by EPMA measurement indicated a value close to the numerical values of the mass ratio of Al and N in the aluminum nitride. Further, the content of O was low. For these reasons, it was confirmed that the aluminum nitride particles maintained the crystalline structure of aluminum nitride and suppressed the formation of composite oxides such as Al—O—N.

At the three points (p4, p5, and p6) of the backscattered electron images of the sintered body according to example 5 shown in FIGS. 10 and 11, it was confirmed that there were substantial amounts of O and Eu present between the aluminum nitride particles constituting the base material of the sintered body by EDX measurement. The substantial amounts of O and Eu present between the aluminum nitride particles is conceivably due to the formation of a liquid phase between the aluminum nitride particles. This liquid phase is a composite oxide formed by a reaction between the europium oxide included in the raw material mixture and the oxide formed on the surfaces of the aluminum nitride particles. Note that N was not detected at three points (p4, p5, and p6) between the aluminum nitride particles of the backscattered electron images of the cross section of the sintered body according to example 5 shown in FIGS. 10 and 11. This indicates that the amount of N is less than the detection limit of EDX at the measured points p4, p5 and p6 between the aluminum nitride particles. Accordingly, composite oxides such as Al—O-Eu, for example, are conceivably formed between the aluminum nitride particles. At one point (p7) in the aluminum nitride particles of the backscattered electron image in the cross section of the sintered body according to example 5 shown in FIG. 11, Eu was not detected between the aluminum nitride particles in the sintered body. This indicates that, at p7, the amount of Eu is less than the detection limit of EDX.

In the sintered body according to example 5, the average value of the europium amount $X_1$ in the aluminum nitride particles was 0.12, the average value of the aluminum amount $Y_1$ in the aluminum nitride particles was 69.13, and the first ratio $X_1/Y_1$ was 0.0017.

In the sintered body according to example 5, the average value of the europium amount $X_2$ between the aluminum nitride particles was 77.0, the average value of the aluminum amount $Y_2$ between the aluminum nitride particles was 8.8, and the second ratio $X_2/Y_2$ was 8.7.

INDUSTRIAL APPLICABILITY

The sintered body according to the present embodiment can be utilized in a semiconductor package. Further, the sintered body can be combined with a light emitting element of an LED or an LD serving as an excitation light source and utilized as an illumination device for use in a vehicle or in general lighting or a wavelength conversion member of a backlight for a liquid crystal display device. Further, the sintered body can also be utilized as an ultraviolet light detector.

REFERENCE SIGNS LIST

1 LED element
2 Substrate
3, 13, 23: Sintered body
4, 14, 24: Light reflecting member
5: Wiring line
12: Second LD element
15: Package member
16: Submount
100, 200, 300: Light emitting device

What is claimed is:

1. A sintered body comprising:
aluminum nitride, and
europium,
the sintered body having a thermal diffusivity that is 27.0 mm²/s or greater as measured by a laser flash method at 25° C., and emitting green light when excited by an excitation light source,
wherein a content of the europium is in a range of 0.2 mass % to 1.7 mass % relative to a total amount of the sintered body.

2. A sintered body comprising:
aluminum nitride, and
europium,
the sintered body having a thermal diffusivity that is 55 mm²/s or greater as measured by a laser flash method at 25° C., and emitting green light when excited by an excitation light source.

3. The sintered body according to claim 1, wherein the thermal diffusivity is 55 mm²/s or greater.

4. The sintered body according to claim 1, wherein
the sintered body includes the aluminum nitride as a base material, and
the sintered body does not include a metal element other than aluminum and the europium.

5. The sintered body according to claim 1, wherein the green light has a light emission peak wavelength in a range from 500 nm to 550 nm.

6. A sintered body comprising:
aluminum nitride, and
europium,
the sintered body having a thermal diffusivity that is 27.0 mm²/s or greater as measured by a laser flash method at 25° C., and emitting green light when excited by an excitation light source,
wherein an apparent density is 2.5 g/cm³.

7. A light emitting device comprising:
the sintered body according to claim 1, and
an excitation light source.

8. The light emitting device according to claim 7, wherein the excitation light source is a light emitting element that emits light having a light emission peak wavelength in a range from 200 nm to 480 nm.

9. The light emitting device according to claim 7, wherein the excitation light source is a semiconductor laser element.

10. The sintered body according to claim 2, wherein
the sintered body includes the aluminum nitride as a base material, and the sintered body does not include a metal element other than aluminum and the europium.

11. The sintered body according to claim 2, wherein the green light has a light emission peak wavelength in a range from 500 nm to 550 nm.

12. A light emitting device comprising:
the sintered body according to claim 2, and
an excitation light source.

13. The light emitting device according to claim 12, wherein the excitation light source is a light emitting element that emits light having a light emission peak wavelength in a range from 200 nm to 480 nm.

14. The light emitting device according to claim 12, wherein the excitation light source is a semiconductor laser element.

15. The sintered body according to claim 6, wherein a content of the europium is in a range from 0.2 mass % to 1.7 mass % relative to a total amount of the sintered body.

16. The sintered body according to claim 6, wherein the thermal diffusivity is 55 mm²/s or greater.

17. The sintered body according to claim 6, wherein
the sintered body includes the aluminum nitride as a base material, and
the sintered body does not include a metal element other than aluminum and the europium.

18. The sintered body according to claim 6, wherein the green light has a light emission peak wavelength in a range from 500 nm to 550 nm.

19. A light emitting device comprising:
the sintered body according to claim 6, and
an excitation light source.

20. The light emitting device according to claim 19, wherein the excitation light source is a light emitting element that emits light having a light emission peak wavelength in a range from 200 nm to 480 nm.

21. The light emitting device according to claim 19, wherein the excitation light source is a semiconductor laser element.

\* \* \* \* \*